United States Patent
Yun et al.

(10) Patent No.: US 11,462,271 B2
(45) Date of Patent: Oct. 4, 2022

(54) NONVOLATILE MEMORY DEVICE AND OPERATION METHOD THEREOF

(71) Applicant: Samsung Electronics Co., Ltd., Suwon-si (KR)

(72) Inventors: Jae-Hak Yun, Suwon-si (KR); Jae Woo Im, Yongin-si (KR); Sang-Hyun Joo, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 4 days.

(21) Appl. No.: 17/126,933

(22) Filed: Dec. 18, 2020

(65) Prior Publication Data

US 2021/0312989 A1    Oct. 7, 2021

(30) Foreign Application Priority Data

Apr. 3, 2020 (KR) .......................... 10-2020-0040747

(51) Int. Cl.
| | |
|---|---|
| *G06F 12/02* | (2006.01) |
| *G06F 3/06* | (2006.01) |
| *G11C 16/04* | (2006.01) |
| *G11C 16/08* | (2006.01) |
| *G11C 7/12* | (2006.01) |
| *G11C 8/08* | (2006.01) |
| *G11C 11/4074* | (2006.01) |

(52) U.S. Cl.
CPC .......... *G11C 16/08* (2013.01); *G11C 16/0483* (2013.01); *G06F 3/0614* (2013.01); *G06F 3/0634* (2013.01); *G11C 11/4074* (2013.01)

(58) Field of Classification Search
CPC . G11C 16/0483; G11C 16/08; G11C 11/4074; G06F 3/0614; G06F 3/0634
USPC .................................................... 365/185.11
See application file for complete search history.

(56) References Cited

U.S. PATENT DOCUMENTS

| | | | |
|---|---|---|---|
| 9,142,324 B2 | 9/2015 | Raghu et al. | |
| 9,633,738 B1* | 4/2017 | Guo | .............. G11C 16/30 |
| 10,248,515 B2* | 4/2019 | Srinivasan | ........... G06F 11/2094 |

(Continued)

FOREIGN PATENT DOCUMENTS

| | | | | |
|---|---|---|---|---|
| CN | 107689236 A | * | 2/2018 | ......... G11C 11/4074 |
| JP | 2009-146482 A | | 7/2009 | |

(Continued)

*Primary Examiner* — Ly D Pham
(74) *Attorney, Agent, or Firm* — Harness, Dickey & Pierce, P.L.C.

(57) ABSTRACT

A nonvolatile memory device and an operating method are provided. The nonvolatile memory device includes a memory cell array including a plurality of planes, each plane including a plurality of memory blocks, an address decoder connected to the memory cell array, a voltage generator configured to apply an operating voltage to the address decoder, a page buffer circuit including page buffers corresponding to each of the planes, a data input/output circuit connected to the page buffer circuit configured to input and output data and a control unit configured to control the operation of the address decoder, the voltage generator, the page buffer circuit, and the data input/output circuit, wherein the control unit is configured to operate in a multi-operation or a single operation by checking whether a memory block of an access address is a bad block.

20 Claims, 13 Drawing Sheets

(56) References Cited

U.S. PATENT DOCUMENTS

| | | | |
|---|---|---|---|
| 2010/0271879 A1 | 10/2010 | Makino | |
| 2018/0189125 A1* | 7/2018 | Karlik | G11C 29/12005 |
| 2018/0203774 A1* | 7/2018 | Srinivasan | G11C 16/10 |
| 2019/0196744 A1 | 6/2019 | Kim | |
| 2021/0216469 A1* | 7/2021 | Park | G06F 12/10 |

FOREIGN PATENT DOCUMENTS

| | | |
|---|---|---|
| KR | 101088450 B1 | 12/2011 |
| KR | 101399549 B1 | 5/2014 |

\* cited by examiner

(12) United States Patent

NONVOLATILE MEMORY DEVICE AND OPERATION METHOD THEREOF

CROSS-REFERENCE TO RELATED APPLICATION

This application claims priority from Korean Patent Application No. 10-2020-0040747 filed on Apr. 3, 2020 in the Korean Intellectual Property Office, and all the benefits accruing therefrom under 35 U.S.C. 119, the contents of which in its entirety are herein incorporated by reference.

BACKGROUND

1. Field

The present inventive concepts relate to a semiconductor memory, and more particularly, to a nonvolatile memory device and an operating method of the same.

2. Description of the Related Art

A semiconductor memory device is a storage device that is implemented using a semiconductor such as silicon (Si), germanium (Ge), gallium arsenide (GaAs) or indium phosphide (InP). The semiconductor memory device may be broadly classified into a volatile memory device and a nonvolatile memory device.

The volatile memory device is a memory device in which stored data dissipate when a power supply is cut off. The volatile memory devices may include an SRAM (Static RAM), a DRAM (Dynamic RAM), an SDRAM (Synchronous DRAM), and the like. The nonvolatile memory device is a memory device that retains stored data even when the power supply is cut off. The nonvolatile memory device may include a flash memory device, a ROM (Read Only Memory), a PROM (Programmable ROM), an EPROM (Electrically Programmable ROM), an EEPROM (Electrically Erasable and Programmable ROM), a resistive memory device (e.g., a PRAM (Phase-change RAM), a FRAM (Ferroelectric RAM), and a RRAM (Resistive RAM)) and the like.

With the development of semiconductor technology, a storage device based on a flash memory is being developed. In a single-plane structure semiconductor memory, a memory operation is performed on only one block at a time. On the other hand, in a multi-plane structure semiconductor memory, since the memory operation may be performed on blocks (adjacent blocks) consecutively arranged in adjacent planes at the same time, the performance is improved. Therefore, the multi-plane structure may be used to improve the performance of the semiconductor memory device.

SUMMARY

Aspects of the present inventive concepts provide a nonvolatile memory device configured to perform an operation suitable for the number of planes that actually operate when a bad block is included.

Aspects of the present inventive concepts also provide a method of operating a nonvolatile memory device that performs an operation suitable for the number of actually operating planes when a bad block is included.

One aspect of the present inventive concepts provides a nonvolatile memory device includes a memory cell array including a plurality of planes, each plane including a plurality of memory blocks, an address decoder connected to the memory cell array, a voltage generator configured to apply an operating voltage to the address decoder, a page buffer circuit including page buffers corresponding to each of the planes, a data input/output circuit connected to the page buffer circuit configured to input and output data and a control unit configured to control the operation of the address decoder, the voltage generator, the page buffer circuit, and the data input/output circuit, wherein the control unit is configured to operate in a multi-operation or a single operation by checking whether a memory block of an access address is a bad block.

Another aspect of the present inventive concepts provide a method of operating a nonvolatile memory device including a memory cell array of a multi-plane structure each including a plurality of memory blocks, the method includes receiving a command, an access address and data from a storage controller, checking whether a bad block is included among the memory blocks corresponding to the access address, operating in a multi-operation which simultaneously performs a memory operation on at least two or more memory blocks, when there is no bad block among the memory blocks and operating in a single operation which performs the memory operation for each memory block, when the bad block is included among the memory blocks.

Other aspect of the present inventive concepts provide a storage device includes a storage controller configured to receive instructions from a host and outputs commands, access addresses, and data and a nonvolatile memory device configured to perform a memory operation based on the command in a memory block corresponding to the access address, wherein the nonvolatile memory device includes a memory cell array including a plurality of planes each including a plurality of memory blocks, an address decoder connected to word lines of the memory cell array in accordance with a first control signal and is configured to enable a word line address corresponding to the access address, a voltage generator configured to adjust an operating voltage level in accordance with a second control signal and applies an operating voltage to the address decoder, and a page buffer circuit including a plurality of page buffers connected to each of the plurality of planes and is configured to write the data in the memory block or reads the stored data, and a control unit configured to receive the access address and the command and generates the first and second control signals, the control unit adjusts the first control signal to lower the operating voltage level in the case of existence of at least one bad block among memory blocks corresponding to the access address, and to raise the operating voltage level in the case of absence of the bad block.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

DETAILED DESCRIPTION OF EXAMPLE EMBODIMENTS

Figure 1:
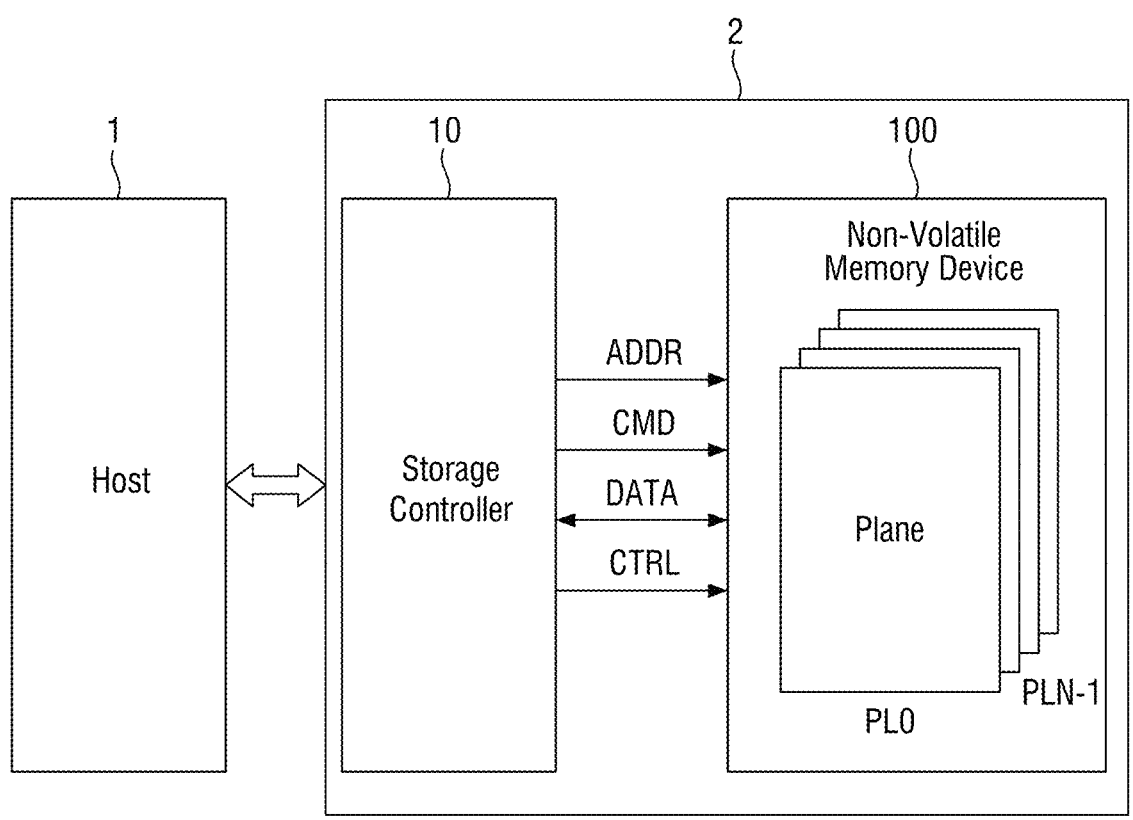
FIG. 1 is a schematic block diagram showing a nonvolatile memory system according to some example embodiments.

FIG. 1 is a schematic block diagram showing a nonvolatile memory system according to some example embodiments.

Referring to FIG. 1, the nonvolatile memory system may include a host 1 and/or a storage device 2. The storage device 2 may include a storage controller 10 and/or at least one nonvolatile memory device 100. The host 1 generally controls the operation of the storage device 2. The storage controller 10 may exchange signals, such as a command CMD, an address ADDR, data DATA, and/or a control signal CTRL, with the nonvolatile memory device 100.

The storage controller 10 may program or erase data in the nonvolatile memory device 100 or may read data from the nonvolatile memory device 100 in accordance with the commands of the host 1.

The nonvolatile memory device 100 may include a plurality of planes PL0 to PLN-1.

Each of the plurality of planes includes a plurality of memory blocks. Each of the plurality of memory blocks includes a plurality of strings. Each of the plurality of strings includes a plurality of memory cells. Each of the plurality of memory cells is connected to a plurality of word lines. Each of the plurality of memory cells may be provided as a single level cell (SLC) that stores 1-bit data or a multi-level cell (MLC) that stores at least 2-bits data. The plurality of planes, the plurality of memory blocks, and the plurality of strings will be explained in more detail with reference to FIGS. 2 to 4.

Figure 2:
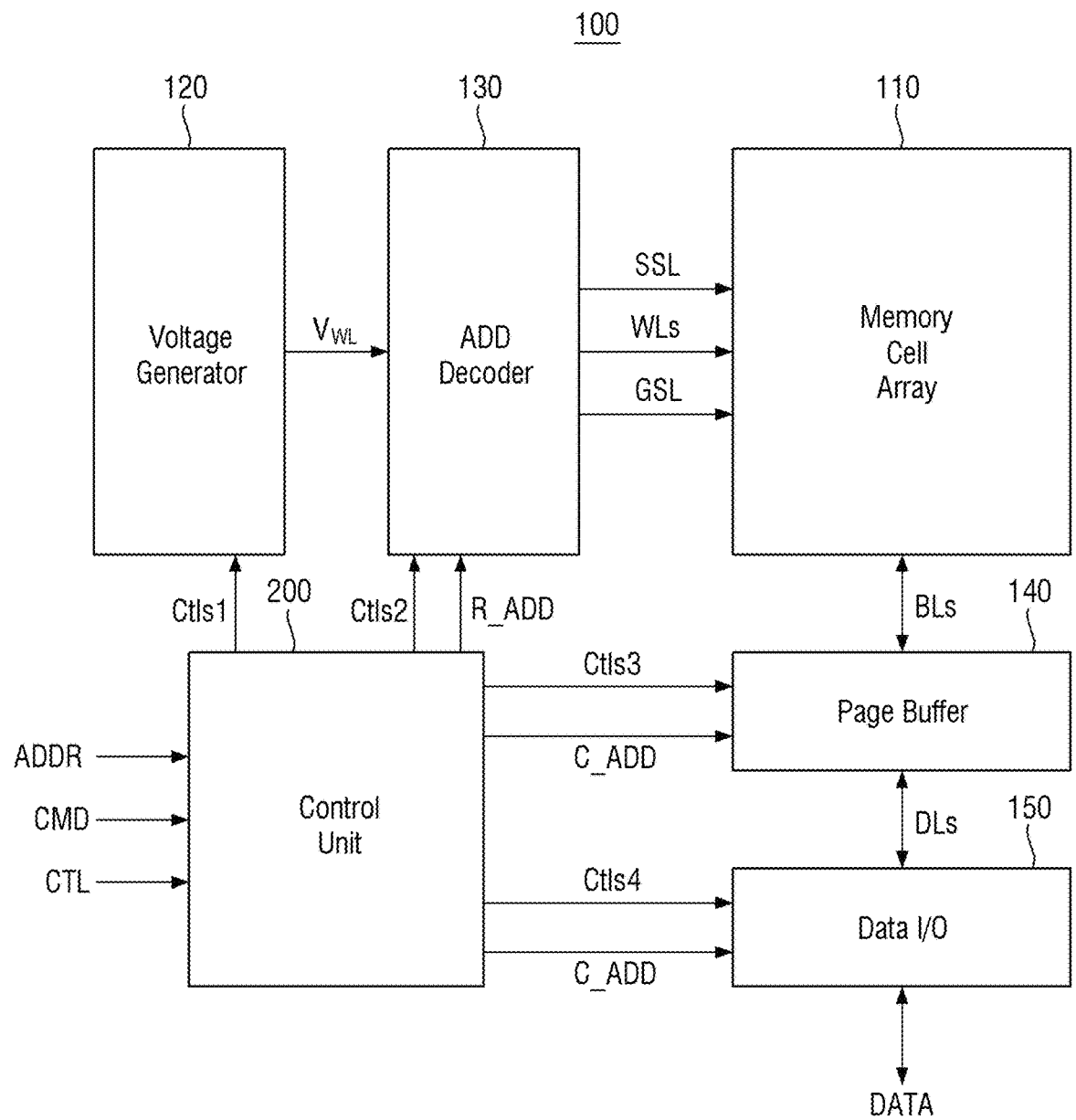
FIG. 2 is a block diagram showing the nonvolatile memory device shown in FIG. 1 according to some example embodiments.
Figure 3:
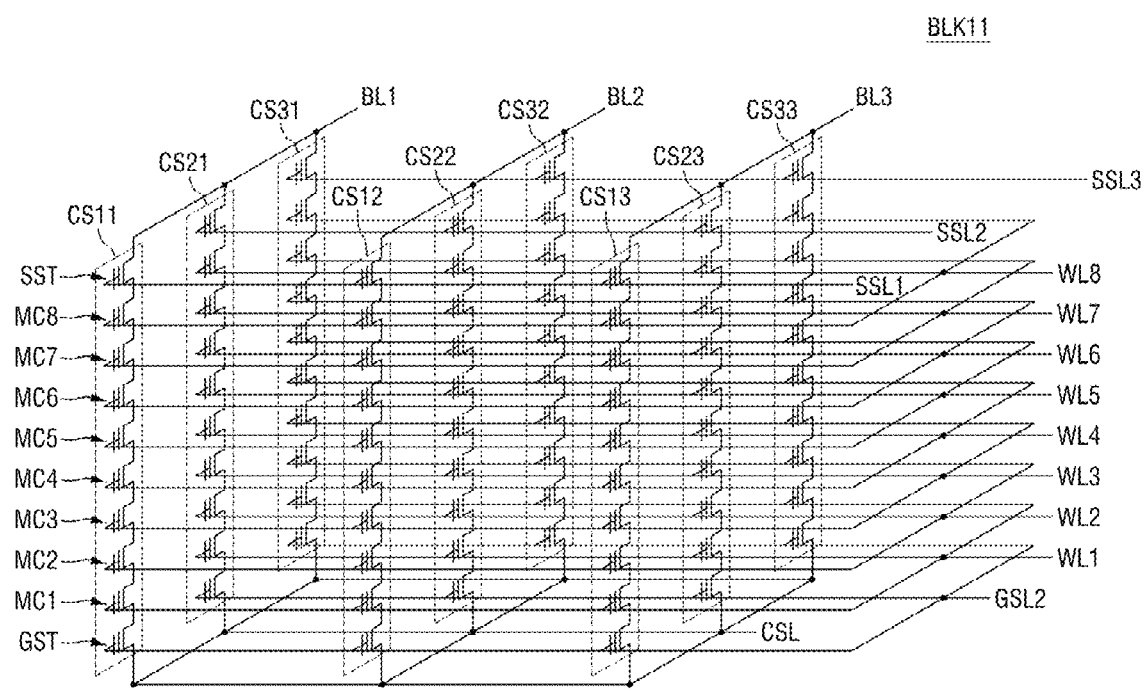
FIG. 3 is an equivalent circuit diagram showing the memory cell array of FIG. 2 according to some example embodiments.
Figure 4:
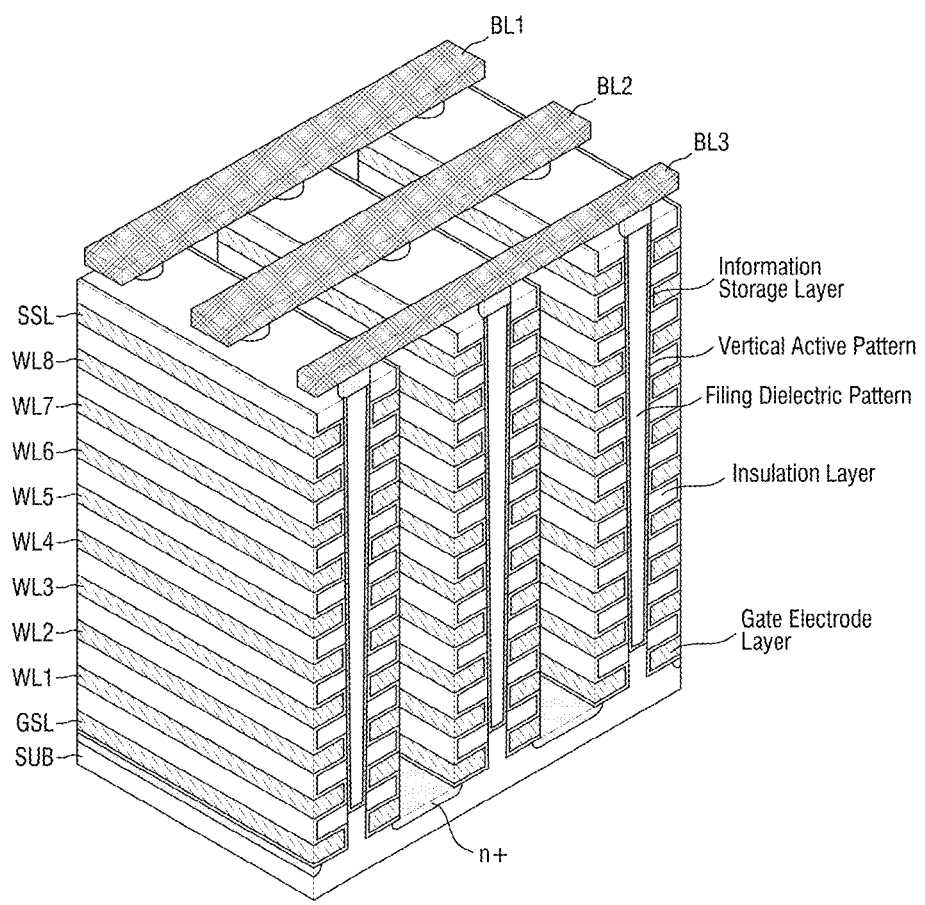
FIG. 4 is a perspective view showing one block of the memory cell array of FIG. 2 according to some example embodiments.

FIG. 2 is a block diagram showing the nonvolatile memory device shown in FIG. 1 according to some example embodiments, and FIG. 3 is an equivalent circuit diagram showing the memory cell array of FIG. 2 according to some example embodiments. FIG. 4 is a perspective view showing one block of the memory cell array of FIG. 2 according to some example embodiments.

Referring to FIG. 2, the nonvolatile memory device 100 may include a memory cell array 110, a voltage generator 120, an address decoder 130, a page buffer circuit 140, a data input/output circuit 150, and/or a control unit 200.

The memory cell array 110 may include a plurality of memory cells connected to a plurality of word lines WLs and a plurality of bit lines BLs. In some example embodiments, the memory cell array 110 may include memory cells connected to each of the word lines stacked on a substrate.

The memory cell array 110 may be connected to the address decoder 130 through a string selection line SSL, a plurality of word lines WLs, and/or a ground selection line GSL. In addition, the memory cell array 110 may be connected to the page buffer circuit 140 through a plurality of bit lines BLs.

The memory cell array 110 includes a plurality of memory blocks (BLK1 to BLKz, z is a natural number of 3 or more). In some example embodiments, the memory blocks BLK1 to BLKz are selected by the address decoder 130. For example, the address decoder 130 may select the memory block BLK corresponding to the block address, among the memory blocks BLK1 to BLKz. The address decoder 130 may select at least one row in the memory block BLK in response to the row address R_ADDR.

Referring to FIG. 3, cell strings CS11 to CS33 are connected between the bit lines BL1 to BL3 and a common source line CSL. Each cell string (e.g., CS11) includes a string selection transistor SST, a plurality of memory cells MC1 to MC8, and/or a ground selection transistor GST.

The string selection transistor SST is connected to string selection lines SSL1 to SSL3. Each of the plurality of memory cells MC1 to MC8 is connected to the corresponding word lines WL1 to WL8. The ground selection transistor GST is connected to the ground selection line GSL. The string selection transistor SST is connected to the bit line BL, and the ground selection transistor GST is connected to the common source line CSL.

Word lines of the same height (e.g., WL1) are commonly connected, and string selection lines SSL1 to SSL3 are separated. When programming a memory cell (hereinafter referred to as a page) that is connected to the first word line WL1 and belongs to the cell strings CS11, CS12 and CS13, the first word line WL1 and the first selection line SSL1 are selected.

As an example, one memory block BLK11 among the plurality of memory blocks BLK11 to BLK1n and BLK21 to BLK2n is shown in FIG. 4. However, the scope of the present inventive concepts is not limited thereto.

Referring to FIG. 4, the memory block BLK11 includes a gate electrode layer, an insulation layer, a vertical active pattern, and/or an information storage layer. The memory block BLK1 is formed in a direction perpendicular to a substrate SUB. An n+ doping region is formed on the substrate SUB. The gate electrode layer and the insulation layer are alternately deposited on the substrate SUB. In addition, a charge storage layer may be formed between the gate electrode layer and the insulation layer.

Vertical patterning of the gate electrode layer and the insulation layer forms a V-shaped pillar. The pillar penetrates the gate electrode layer and the insulation layer and is connected to the substrate SUB. An outer portion of the pillar may be formed of a channel semiconductor, and an inner portion thereof may be formed of an insulating material such as silicon oxide.

Referring to FIG. 4, the gate electrode layer of the memory block BLK11 may be connected to the ground selection line GSL, the plurality of word lines WL1 to WL8 and the string selection line SSL. Further, the pillar of the memory block BLK11 may form a plurality of bit lines BL1 to BL3. Although FIG. 4 shows that one memory block BLK1 has two selection lines GSL and SSL, eight word lines WL1 to WL8, and three bit lines BL1 to BL3, the number thereof may be actually greater or smaller than those numbers.

Referring again to FIG. 2, the control unit 200 may receive the command CMD and address ADDR from the storage controller 10, and may control the erase action, the program action and the read action of the nonvolatile memory device 100 on the basis of the command CMD and the address ADDR.

For example, the control unit 200 may generate control signals CTLs for controlling the voltage generator 120 on the basis of the command CMD, and may generate a row address R_ADDR and a column address C_ADDR on the basis of the address signal ADDR. The control unit 200 may provide the row address R_ADDR to the address decoder 130, and may provide the column address C_ADDR to the data input/output circuit 150.

The address decoder 130 may be connected the memory cell array 110 through the string selection line SSL, a plurality of word lines WLs and/or the ground selection line GSL. The voltage generator 120 may generate word line voltages VWL necessary for the operation of the nonvolatile memory device 100 on the basis of the control signals CTLs provided from the control unit 200. The word line voltages VWL generated from the voltage generator 120 may be applied to the plurality of word lines WLs through the address decoder 130.

According to some example embodiments, the voltage generator 120 may apply a program voltage to a selected word line and may apply a program pass voltage to a non-selected word line at the time of the program action. According to some example embodiments, the voltage generator 120 may apply a program verification voltage to a selected word line and may apply a verification pass voltage to a non-selected word line at the time of the program verification action. According to some example embodiments, the voltage generator 120 may apply a read voltage to a selected word line and may apply a read pass voltage to a non-selected word line at the time of the read action. According to some example embodiments, the voltage generator 120 may apply an erase voltage to a well or substrate of a memory block and may apply a word line erase voltage, that is, a ground voltage, to the word lines of the selected memory block at the time of the erase action. According to some example embodiments, the voltage generator 120 may apply the erase verification voltage to the word lines of the selected block or may apply the erase verification voltage in word line units at the time of the erase verification action.

The page buffer circuit 140 may be connected to the memory cell array 110 through a plurality of bit lines BLs. The page buffer circuit 140 may include a plurality of page buffers. According to some example embodiments, the number of page buffers may correspond to the number of planes. The page buffer circuit 140 may temporarily store the data to be programmed in the selected page at the time of the program action, and may temporarily store the data read from the selected page at the time of the read action.

The data input/output circuit 150 may be connected to the page buffer circuit 140 through the data lines DLs. At the time of the program action, the data input/output circuit 150 may receive the program data DATA from the memory controller 10, and may provide the program data DATA to the page buffer circuit 140 on the basis of the column address C_ADDR provided from the control unit 200. At the time of the read action, the data input/output circuit 150 may store the read data DATA stored in the page buffer circuit 140 to the storage controller 10, on the basis of the column address C_ADDR provided from the control unit 200.

Figure 5:
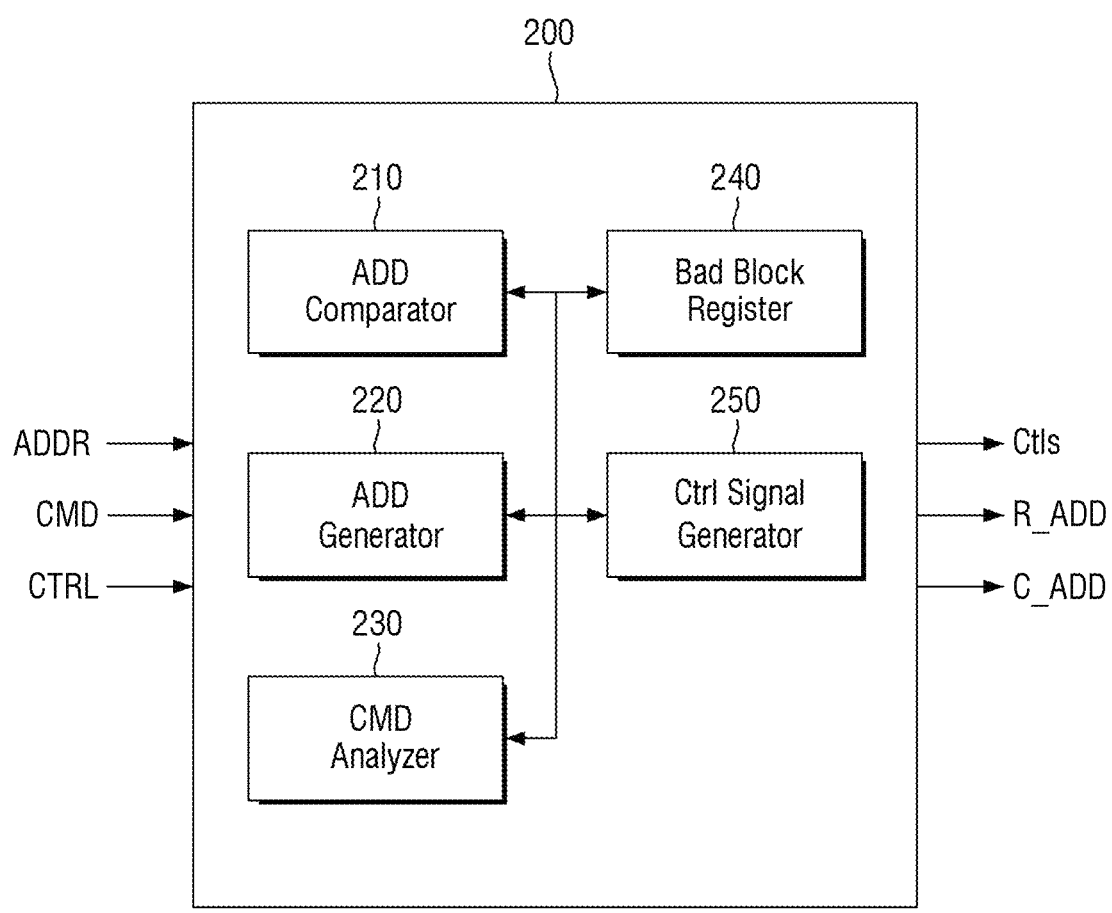
FIG. 5 is a block diagram showing a configuration of the control unit shown in FIG. 2 according to some example embodiments.

FIG. 5 is a block diagram showing a configuration of the control unit shown in FIG. 2 according to some example embodiments.

In FIG. 5, according to some example embodiments, the control unit 200 may include an address comparator 210, an address generator 220, a command analyzer 230, a bad block register 240 and/or a control signal generator 250.

The address generator 220 receives an address ADDR to be accessed from the storage controller 10, generates the row address R_ADD and the column address C_ADD of the address ADDR, and transmits them to the respective circuits 130, 140 and 150. The row address R_ADD is transmitted to the address decoder 130, and the column address C_ADD is transmitted to the page buffer 140 and the data input/output circuit 150.

The command analyzer 230 analyzes the command CMD received from the storage controller 10, and transmits the analyzed command to the control signal generator 250.

The bad block register 240 may store the addresses of the bad blocks. The bad block register 240 may include not only the initial bad block address but also a run-time bad block address generated by the use of the nonvolatile memory device 100. The initial bad block is referred to as a bad block designated before the nonvolatile memory device 10 is used for the first time, that is, from the time of product shipment.

The address comparator 210 may compare an address of the memory block generated by the address generator 220 with a bad block address stored in the bad block register 240.

When the address of the memory block to be accessed is equal to one of the bad block addresses stored in the bad block register 240, the address comparator 210 transmits the first comparison result signal to the control signal generator 250 so that the nonvolatile memory device 100 operates in a single operation.

If the address of the memory block to be accessed does not correspond to all the bad block addresses stored in the bad block register 240, the address comparator 210 transmits the second comparison result signal to the control signal generator 250 so that the nonvolatile memory device 100 operates in a multi-operation.

The control signal generator 250 may generate control signals Ctrl1 or Ctrl4 for controlling each of the configurations 120, 130, 140 and 150 of the nonvolatile memory device 100 according to the analyzed command and the comparison result signal.

According to some example embodiments, the control signal generator 250 transmits the control signal Ctrl1 to the voltage generator 120 so that operating voltages (Verase, Vgpm, Vread, Vpass, Vvfy, Vds1, Vss1 and Vs1) for executing a program loop, a read action or an erase loop according to the analyzed command and the comparison result signal, or global lines (GSSL, GWL0 to GWLn and GDSL) may be generated at an appropriate level. Further, the control signal generator 250 outputs a control signal Ctrl3 for controlling the page buffer 140 to execute the program loop, the read loop or the erase loop. The program loop includes a program action and a program verification action, and the program loop may be performed in an ISPP (Increment Step Pulse Program) manner. The erase loop includes an erase action and an erase verification action, and the erase loop may be performed in an ISPE (Increment Step Pulse Erase) manner.

According to some example embodiments, when the memory block to be accessed corresponds to a bad block, the control signal generator 250 may transmit a control signal Ctrl1 to be transmitted to the voltage generator 120, by setting the control signal Ctrl1 in a single operation mode in accordance with the first comparison result signal. According to some example embodiments, when the memory block to be accessed does not correspond to the bad block, the control signal generator 250 transmits the control signal Ctrl1 to be transmitted to the voltage generator 120, by setting the control signal Ctrl1 in a multi-operation mode in accordance with the second comparison result signal.

The single operation and the multi-operation will be described below with reference to FIGS. 7A to 10.

According to some example embodiments, the control signal generator 250 may transmit the control signals Ctrl 2, Ctrl 3 and Ctrl 4 to each of the configurations 130, 140 and 150 to differently adjust the timing of the voltages to be applied to each of the word lines, global lines or column lines in accordance with the analyzed command and the comparison result signal.

Figure 6:
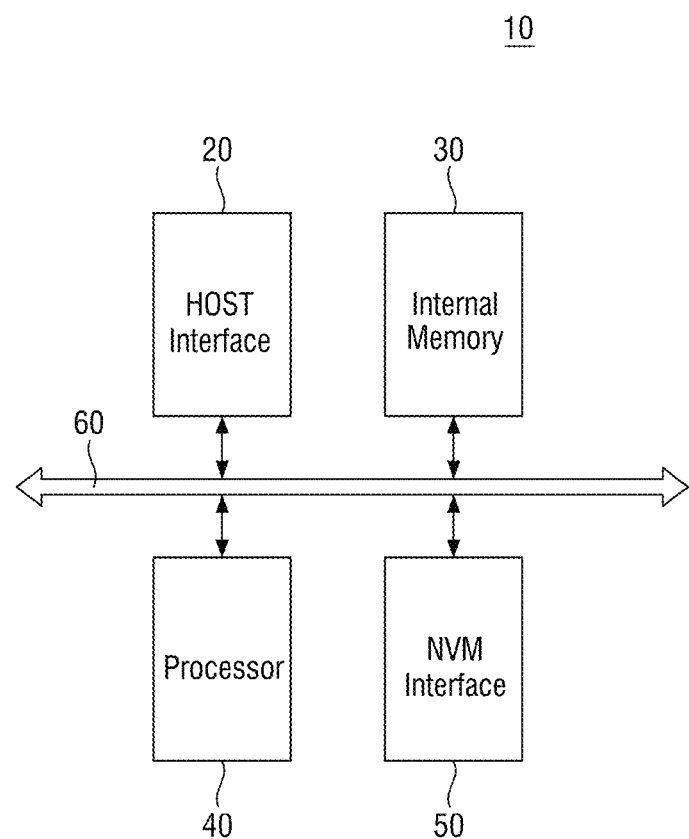
FIG. 6 is a block diagram showing the storage controller shown in FIG. 1 according to some example embodiments.

FIG. 6 is a block diagram showing the storage controller shown in FIG. 1 according to some example embodiments.

Referring to FIG. 6, the storage controller 10 according to some example embodiments may include a host interface 20, an internal memory 30, a processor 40 and/or a non-volatile memory interface 50.

The storage controller 10 may communicate with the host 1 through the host interface 20. For example, the host interface 20 may be provided as at least one of various interfaces such as a USB (Universal Serial Bus), an MMC (multimedia card), a PCI (peripheral component interconnection), a PCI-E (PCI-express), an ATA (Advanced Technology Attachment), a Serial-ATA, a Parallel-ATA, an SCSI (small computer small interface), an ESDI (enhanced small disk interface), an IDE (Integrated Drive Electronics), a MIPI (Mobile Industry Processor Interface), a NVMe (Nonvolatile Memory-express), and a UFS (Universal Flash Storage Interface).

The internal memory 30 is a nonvolatile memory according to some example embodiments, which may store various types of information necessary for the operation of the storage controller 10 in the form of firmware. Alternatively, the internal memory 30 is an operating memory according to some example embodiments, and may be a buffer which temporarily stores intermediate data generated during communication between the host 1 and the nonvolatile memory device 100.

According to some example embodiments, the internal memory 30 may include a cache, a ROM (Read Only Memory), a PROM (Programmable Read Only Memory), an EPROM (Erasable PROM), an EEPROM (Electrically Erasable Programmable Read-Only Memory), a PRAM (Phase-change RAM), a Flash memory, an SRAM (Static RAM) or a DRAM (Dynamic RAM).

The processor 40 may control the overall actions of other constituent elements 10, 20, 30 and 50 in the storage controller 10 in accordance with the data DATA and commands received by the host 1.

The storage controller 10 may communicate with the nonvolatile memory device 100 through the nonvolatile memory interface 50.

FIGS. 7A to 10 are conceptual diagrams which explain operation actions in a single plane structure and a multi-plane structure of the memory cell array according to some example embodiments.

Figure 7A:
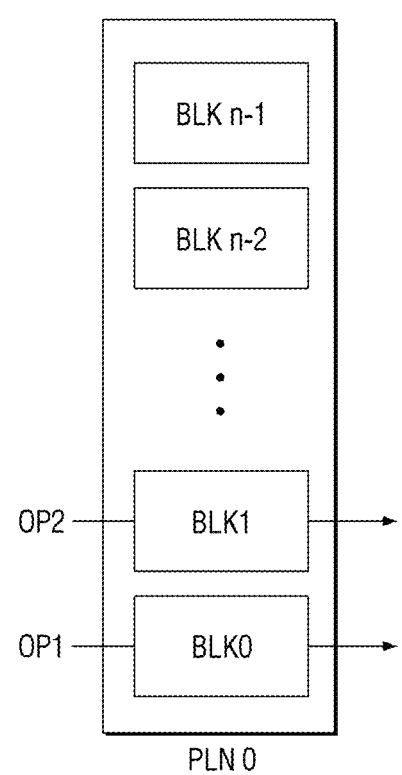
FIGS. 7A to 10 are conceptual diagrams which explain operation actions in a single plane structure and a multi-plane structure of the memory cell array according to some example embodiments.

Referring to FIG. 7A, the flash memory is made up of a single plane PLN0. The plane PLN0 includes a plurality of blocks BLK0 to BLKn-1. Such a structure is referred to as a single plane structure. In the single plane structure, the memory operation is performed on only one block at a time. In this specification, execution of an operation on one block at a time is referred to as a single operation. In this specification, a flash operation includes program, read and erase actions, and the like, and is referred to as a memory operation or a memory action. As shown, when there is an operation request for the blocks BLK0 and BLK1 from the storage controller 10, after a single flash operation OP1 for the block BLK0 is completed, a single flash operation OP2 for the block BLK1 is performed. Eventually, two single flash operations OP1 and OP2 are performed for the two blocks BLK0 and BLK1.

Figure 7B:
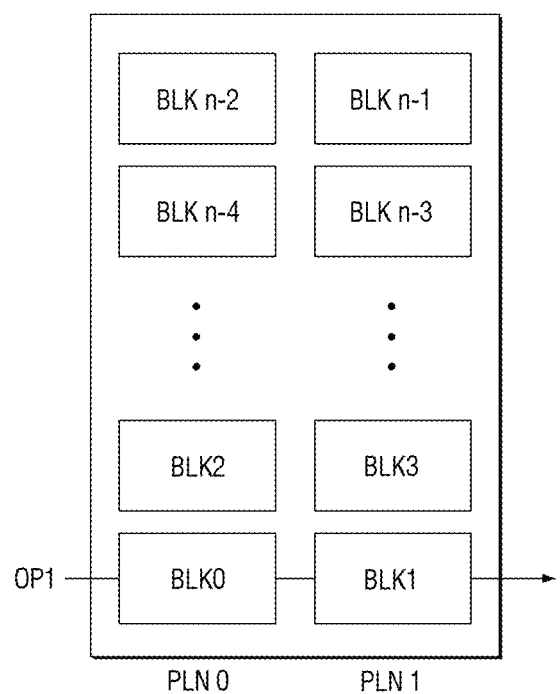

The flash memory of FIG. 7B is made up of two planes PLN0 and PLN1. Each plane includes a plurality of blocks BLK0 to BLKn-1. Such a structure is referred to as a multi-plane structure. Although two planes PLN0 and PLN1 are shown as an example in this embodiment, the scope of the present inventive concepts is not limited thereto. For example, the number of planes may be more than two.

In a multi-plane structure semiconductor memory, blocks BLK are distributed and placed on one or more planes, and simultaneous operation can be performed on the blocks continuously placed on the adjacent planes. In other words, in the multi-plane structure, a flash operation may be performed on the plurality of blocks at once. Execution of an operation on the plurality of blocks at once will be referred to as a multi-operation herein.

As shown, when there is an operation request for the blocks BLK0 and BLK1 from the storage controller 10, one multi-operation OP1 is performed for the blocks BLK0 and BLK1. That is, one flash operation OP1 is performed on the two blocks BLK0 and BLK1.

According to some example embodiments, programming may be simultaneously performed on N pages adjacent to each other in a device equipped with N memory planes (N is a natural number greater than or equal to 2). For example, first, data is loaded into page buffers which are each connected to N pages. After all the N page buffers are filled, N pages are programmed simultaneously. Similarly, N pages may be read or erased simultaneously. Therefore, the time to be taken is reduced as compared with a case where the flash operation is individually performed for each page.

In the single operation, the flash operation is performed on only one block at a time. On the other hand, in the multi-operation, since the flash operation may be performed simultaneously on the adjacent blocks consecutively arranged in the adjacent planes, the performance is improved.

Figure 8:
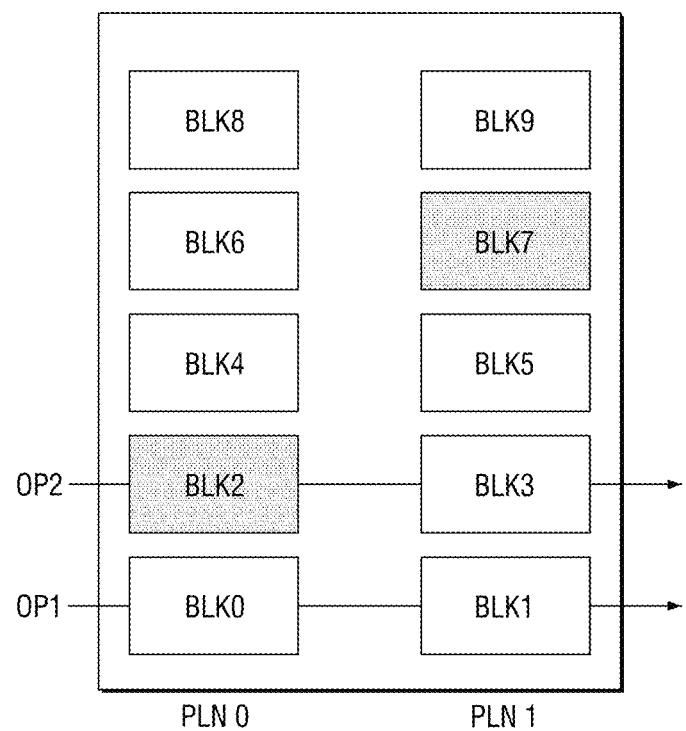
Figure 9:
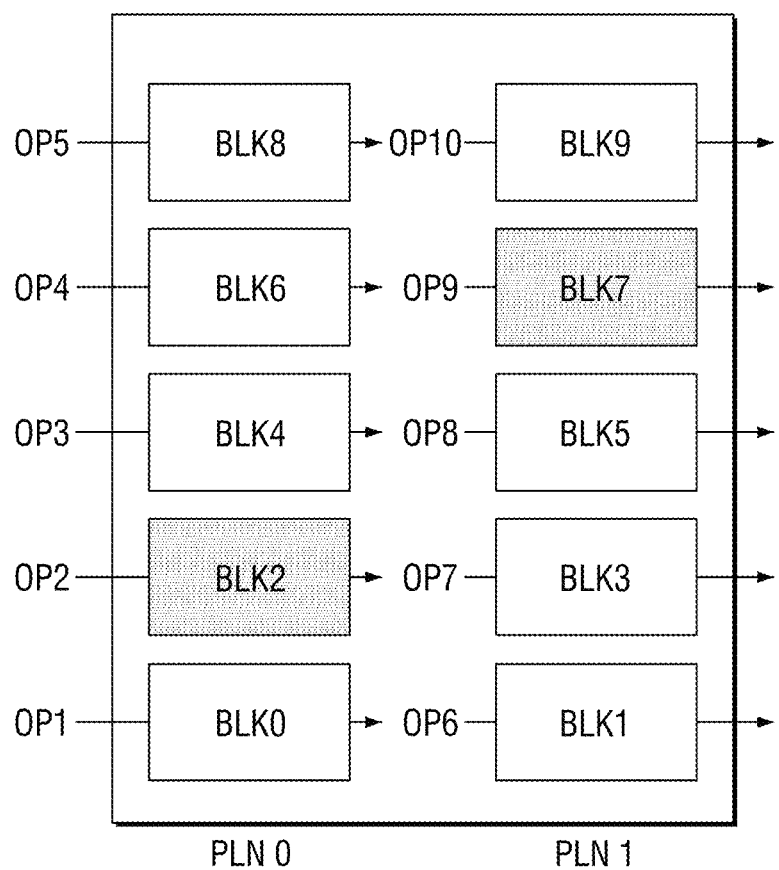
Figure 10:
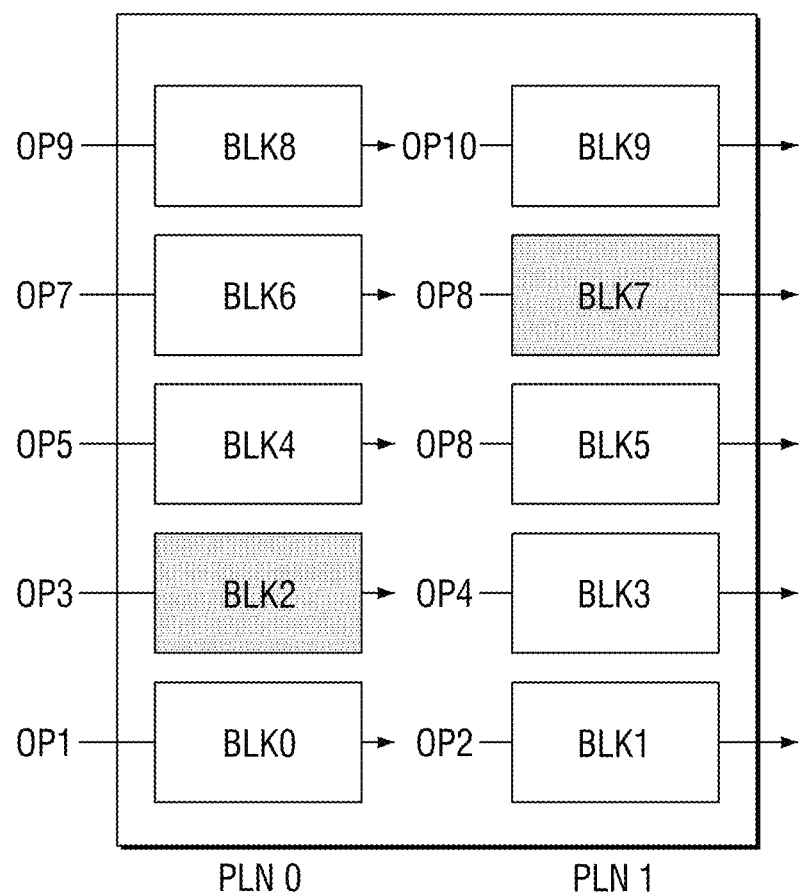

Referring to FIGS. 8 to 10, at least one bad block may be included in a single plane. The bad block may be an initial bad block existing from the time of shipment of the nonvolatile memory device 100, or may be a run-time bad block generated according to the use of the nonvolatile memory device 100. Hereinafter, in some example embodiments, blocks BLK 2 and BLK 7 will be assumed to be bad blocks.

In FIG. 8, if the memory cell array 110 having a multi-plane structure always operates in a multi-operation, the flash operation OP1 may simultaneously perform the flash operation on BLK0 of the plane PLN0 and BLK1 of the plane PLN1. At this time, since there is no bad block, the operation may be performed normally.

The flash operation OP2 may simultaneously perform the flash operation on BLK2 of the plane PLN0 and BLK3 of the plane PLN1. At this time, if the block BLK2 is a bad block, the word line is loaded into only the block BLK3. Incidentally, in the case of multi-operation, since the flash operation is simultaneously performed on a plurality of blocks, a greater load is applied as compared with the single operation.

That is, the voltage generator 120 generates more current in the multi-operation action than in the single-operation action to perform the program action, the erase action or the read action. For example, the DC level of the operating voltages (Verase, Vgpm, Vread, Vpass, Vvfy, Vds1, Vss1 and Vs1) is the same for the case of multi-operation and the case of single-operation, but the amount of current to be supplied may be larger for the case of multi-operation.

By the way, when the multi-operation current is concentrated only on the remaining blocks (block BLK3 in the shown example) due to the bad block BLK2, the applied operating voltage has a relatively sharp slope as compared to the action in the normal block, which may lead to an increase in the high-voltage application time. If the high-voltage application time increases, an actual threshold voltage may be higher than a predetermined or alternatively, desired threshold voltage, and thus, a threshold voltage variation programmed in the block BLK 3 may be worse or fail as compared to the threshold voltage variation due to a normal flash operation.

In order to improve the reliability of a nonvolatile memory cell array of a multi-plane structure including a bad block, the nonvolatile memory device 100 according to some example embodiments may perform a single operation if at least one bad block is included in the plane of an address ADDR to be accessed.

Referring to FIGS. 2 and 5 again, the storage controller 10 transmits an address ADDR to be accessed, and the control unit 200 may compared the address ADDR to be accessed with information of the bad blocks stored in the bad block register 240. The control unit 200 reflects the comparison result in the command received from the storage controller 10, determines whether to operate in a single operation or a multi-operation, and outputs the control signals Ctrl 1 to Ctrl 4.

In FIGS. 9 to 10, when the memory cell array 110 includes the bad blocks BLK2 and BLK7, the nonvolatile memory device 100 may perform the single operation according to some example embodiments. For convenience of explanation, although it is assumed that the memory cell array includes two planes and each plane includes five blocks, the number of planes and the number of memory blocks belonging to each plane may vary according to some example embodiments.

According to some example embodiments, as shown in FIG. 9, the nonvolatile memory device 100 may only enable the page buffer to be accessed, and may access memory blocks of a word line order for each enabled plane. That is to say, the nonvolatile memory device 100 sequentially enables one page buffer among the plurality of page buffers. While the first page buffer is being enabled, the nonvolatile memory device 100 accesses dependent memory blocks in the word line order to perform a flash operation. When the flash operation of the enabled first page buffer is completed, the next second page buffer may be enabled to perform the flash operation on the memory block connected to the second page buffer. In the case of FIG. 9 shown, BLK0, BLK2, BLK4, BLK6 and BLK8 may be accessed in plane PLN0 in the word line order to perform the flash operations OP1 to OP5, and BLK1, BLK3, BLK5, BLK7 and BLK9 may be accessed in plane PLN 1 in the word line order to perform the flash operations OP6 to OP10.

Alternatively, according to some example embodiments as shown in FIG. 10, the nonvolatile memory device 100 may sequentially turn on the page buffers in the same word line to access for each plane in the same word line. In the case of FIG. 10 shown, the blocks BLK0 and BLK1 of the planes PLN0 and PLN1 in the first word line may be accessed to perform the flash operations OP1 and OP2. Blocks BLK2 and BLK3 of the planes PLN0 and PLN1 in the second word line may be accessed to perform the flash operations OP3 and OP4. Blocks BLK4 and BLK5 of the planes PLN0 and PLN1 in the third word line may be accessed to perform the flash operations OP5 and OP6. Blocks BLK6 and BLK7 of the planes PLN0 and PLN1 in the fourth word line may be accessed to perform the flash operations OP7 and OP8. Blocks BLK8 and BLK 9 of the planes PLN0 and PLN1 in the fifth word line may be sequentially accessed to perform the flash operations OP9 and OP10.

If the nonvolatile memory device 100 according to some example embodiments operates in a single operation or multi-operation depending on whether a bad block is included, a threshold voltage variation may be equivalent to a single operation level, and the operating reliability of the memory cells may be improved.

Figure 11:
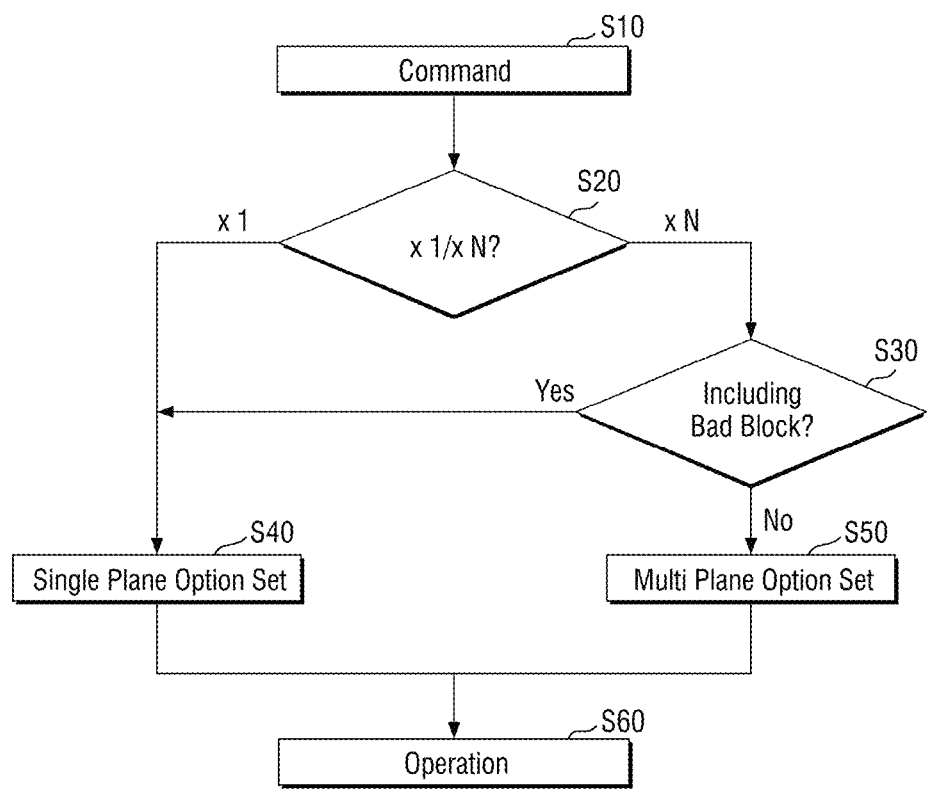
FIG. 11 is a flowchart showing a method of operating a nonvolatile memory device according to some example embodiments.

FIG. 11 is a flowchart showing a method of operating a nonvolatile memory device according to some example embodiments.

When the nonvolatile memory device according to some example embodiments receives a command and an address from the storage controller (S10), the nonvolatile memory device determines whether to perform a single operation (×1) or perform a multi-operation (×N) depending on the structure of the memory cell array in order to execute that command (S20). If the memory cell array includes a multi-plane and there is no bad block, a multi-operation is determined (S50). However, if the address to be accessed is checked and the bad block is included (S30), it is possible to determine to operate in a single operation (S40).

The nonvolatile memory device generates a control signal according to the determined operation and performs a flash operation on the memory block corresponding to the received address (S60). For example, in the case of a memory cell array of a single plane, the flash operation is performed in a single operation. In the case of a memory cell array of a multi-plane, if there is no bad block, the flash operation is performed in a multi-operation, and if there is a bad block, the flash operation is performed in a single operation.

Figure 12:
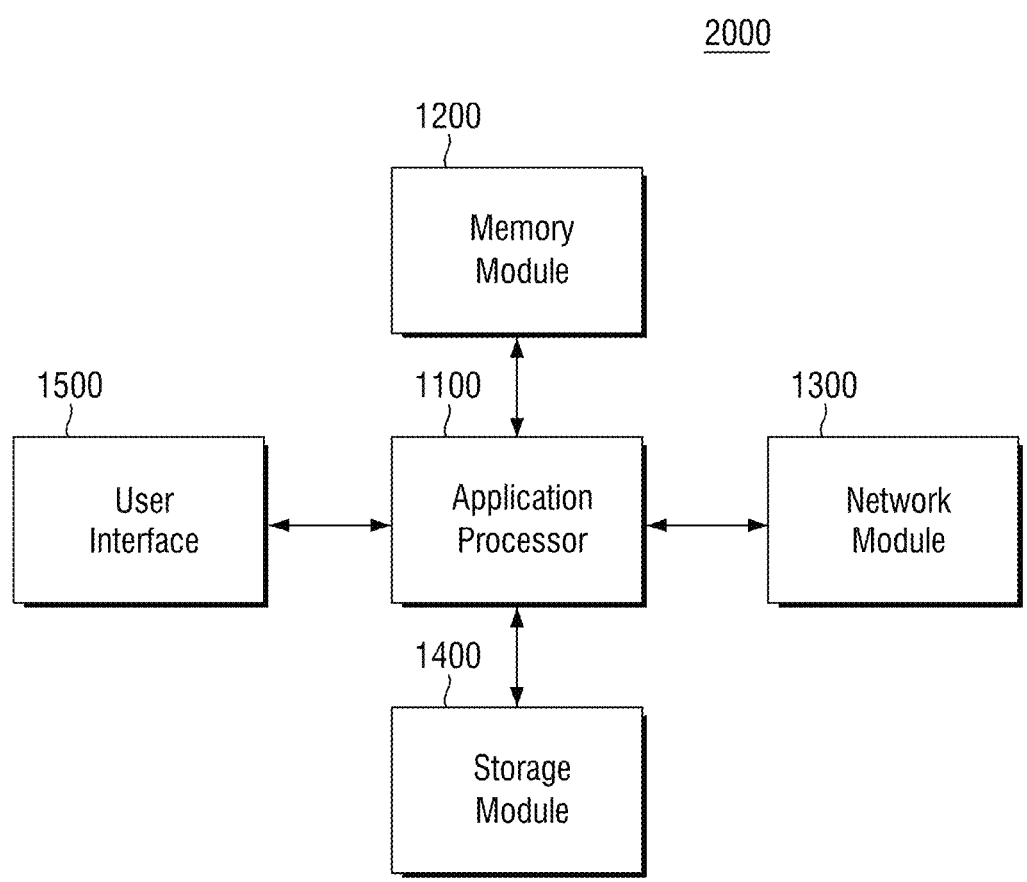
FIG. 12 is a block diagram showing an electronic device including a nonvolatile memory system according to some example embodiments.

FIG. 12 is a block diagram showing an electronic device including a nonvolatile memory system according to some example embodiments.

Referring to FIG. 12, the electronic device 1000 includes an application processor 1100, a memory module 1200, a network module 1300, a storage module 1400, and a user interface 1500. For example, the electronic device 1000 may be provided as one of computing systems such as an UMPC (Ultra Mobile PC), a workstation, a net-book, a PDA (Personal Digital Assistants), a portable computer, a web tablet, a wireless phone, a mobile phone, a smart phone, an e-book, a PMP (portable multimedia player), a portable game console, a navigation device, a black box, a digital camera, a DMB (digital Multimedia Broadcasting) player, a digital audio recorder, a digital audio player, a digital picture recorder, a digital picture player, a digital video recorder, and a digital video player.

The application processor 1100 may drive constituent elements included in the electronic device 1000, an OS (Operating system) and the like. As an example, the application processor 1100 may include a controller that controls constituent elements included in the electronic device 1000, a graphics engine, and various interfaces.

The memory module 1200 may operate as a main memory, an operating memory, a buffer memory or a cache memory of the electronic device 1000. The memory module 1200 may include a volatile random access memory such as a DRAM, an SDRAM, a DDR an SDRAM, a DDR2 SDRAM, a DDR3 SDRAM, a LPDDR DRAM, a LPDDR2 DRAM and a LPDDR3 DRAM or a nonvolatile random access memory such as a PRAM, an ReRAM, a MRAM and a FRAM.

The network module 1300 may communicate with external devices. As an example, the network module 1300 may support wireless communication such as a CDMA (Code Division Multiple Access), a GSM (Global System for Mobile communication), a WCDMA (wideband CDMA), a CDMA-2000, a TDMA (Time Division Multiple Access), an LTE (Long Term Evolution), a Wimax, a WLAN, a UWB, a Bluetooth and a WI-DI.

The storage module 1400 may store data. For example, the storage module 1400 may store data received from the outside. Alternatively, the storage module 1400 may transmit the data stored in the storage module 1400 to the application processor 1400. As an example, the storage module 1400 may be implemented as a semiconductor memory element such as a PRAM (Phase-change RAM), a MRAM (Magnetic RAM), a RRAM (Resistive RAM), a NAND flash, a NOR flash, and a NAND flash of a three-dimensional structure. As an example, the storage module 1400 may include a plurality of nonvolatile memory devices. The plurality of nonvolatile memory devices may be the nonvolatile memory devices described with reference to FIGS. 1 to 11. Alternatively, the storage module 1400 may include the storage controller explained with reference to FIGS. 1 to 11. That is, the storage module 1400 may perform the program, read, and erase actions on the basis of the operation method explained with reference to FIGS. 1 to 11.

The user interface 1500 may include interfaces which input data or commands into the user system 1100 or output data to an external device. As an example, the user interface 1500 may include input devices such as a camera, a touch screen, a motion recognition module and a microphone, or output devices such as a display, a speaker and a touch screen.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the preferred example embodiments without substantially departing from the principles of the present inventive concepts. Therefore, the disclosed preferred example embodiments of the inventive concepts are used in a generic and descriptive sense only and not for purposes of limitation.

What is claimed is:

1. A nonvolatile memory device comprising:
    a memory cell array including a plurality of planes, each plane including a plurality of memory blocks;
    an address decoder connected to the memory cell array;
    a voltage generator configured to apply an operating voltage to the address decoder;
    a page buffer circuit including page buffers corresponding to each of the planes;
    a data input/output circuit connected to the page buffer circuit configured to input and output data; and
    a control unit configured to
        control the operation of the address decoder, the voltage generator, the page buffer circuit, and the data input/output circuit,
        determine whether a memory block of an access address is a bad block,
        operate in a multi-operation in response to determining that the memory block is not a bad block, and
        operate in a single operation in response to determining that the memory block is a bad block.

2. The nonvolatile memory device of claim 1, wherein the control unit includes a bad block register configured to store at least one bad block information, and
    when receiving the access address from a storage controller, the control unit is configured to compare the access address with the stored bad block information.

3. The nonvolatile memory device of claim 2, wherein when a bad block is included as a result of comparison, the control unit is configured to perform a memory operation on the memory block of the access address in a single operation.

4. The nonvolatile memory device of claim 2, wherein the control unit includes
    an address comparator configured to compare the access address with the stored bad block information to output a comparison result; and
    a control signal generator configured to generate at least one control signal for the voltage generator, the address decoder, the page buffer circuit or the data input/output circuit, on the basis of a command received from the storage controller and the comparison result.

5. The nonvolatile memory device of claim 4, wherein the control unit is configured to apply the control signal to the voltage generator to adjust a level of the operating voltage depending on the single operation or the multi-operation.

6. The nonvolatile memory device of claim 4, wherein the control unit is configured to apply the control signal to the page buffer circuit to adjust enable timing of each of the page buffers.

7. The nonvolatile memory device of claim 1, wherein the multi-operation is a memory operation performed at an operating voltage level higher by the number of planes than an operating voltage level of the single operation.

8. A method of operating a nonvolatile memory device including a memory cell array of a multi-plane structure each including a plurality of memory blocks, the method comprising:
    receiving a command, an access address and data from a storage controller;
    determining whether a bad block is included among the memory blocks corresponding to the access address;
    operating in a multi-operation which simultaneously performs a memory operation on at least two or more memory blocks, in response to determining that there is no bad block among the memory blocks; and
    operating in a single operation which performs the memory operation for each memory block, in response to the bad block is included among the memory blocks.

9. The method of operating a nonvolatile memory device of claim 8, wherein in the single operation,
    any one page buffer connected to correspond to a plurality of planes is sequentially enabled,
    while the one page buffer is being enabled, the memory blocks are accessed in a word line order to perform the memory operation, and when the memory operation on the enabled page buffer is completed, only the next page buffer is accessed to perform the memory operation on the memory block connected to the next page buffer.

10. The method of operating a nonvolatile memory device of claim 8, wherein in the single operation,
only one word line of a plurality of word lines is enabled,
page buffers of the memory blocks connected to the enabled first word line are sequentially turned on to perform the memory operation on the memory block, and
when the memory operation on the first word line is completed, the next second word line is enabled and the page buffers are sequentially turned on for the memory blocks connected to the second word line to perform a memory operation on the memory block.

11. The method of operating a nonvolatile memory device of claim 8, wherein the determining includes:
comparing whether the access address is the same as an address of the bad block; and
adjusting a level of an operating voltage to be applied to word lines of the memory cell array on the basis of the command and the comparison result.

12. The method of operating a nonvolatile memory device of claim 11, wherein the multi-operation is a memory operation performed at an operating voltage level higher by the number of planes than an operating voltage level of the single operation.

13. A storage device comprising:
a storage controller configured to receive instructions from a host and outputs commands, access addresses, and data; and
a nonvolatile memory device configured to perform a memory operation based on the command in a memory block corresponding to the access address,
wherein the nonvolatile memory device includes
a memory cell array including a plurality of planes each including a plurality of memory blocks,
an address decoder connected to word lines of the memory cell array in accordance with a first control signal and is configured to enable a word line address corresponding to the access address,
a voltage generator configured to adjust an operating voltage level in accordance with a second control signal and applies an operating voltage to the address decoder, and
a page buffer circuit including a plurality of page buffers connected to each of the plurality of planes and is configured to write the data in the memory block or read stored data, and
a control unit configured to receive the access address and the command and generates the first and second control signals,
the control unit configured to adjust the first control signal to lower the operating voltage level in the case of existence of at least one bad block among memory blocks corresponding to the access address, and to raise the operating voltage level in the case of absence of the bad block.

14. The storage device of claim 13, wherein the control unit includes
a bad block register configured to store an address of the at least one bad block;
an address comparator configured to compare the access address with the address of the at least one bad block;
a command analyzer configured to analyze the commands; and
a control signal generator configured to generate the first and second control signals on the basis of a comparison result from the address comparator and the analyzed commands.

15. The storage device of claim 14, wherein the control signal generator generates a third control signal which enables each of the plurality of page buffers on the basis of the comparison result and the analyzed commands.

16. The storage device of claim 15, wherein the control unit is configured to sequentially enable a first page buffer in accordance with the third control signal, and configured to access the memory blocks in a word line order enabled in accordance with the first control signal during enabling of the first page buffer to perform a memory operation, and
when the memory operation is completed, the control unit is configured to enable a next second page buffer in accordance with the third signal, and is configured to access the memory blocks connected to the second page buffer in accordance with the first control signal to perform the memory operation.

17. The storage device of claim 15, wherein while the first control signal is being enabled for a first word line, the plurality of page buffers is configured to be sequentially enabled in accordance with the third control signal, and the control unit is configured to access the memory block connected to the enabled page buffer to perform the memory operation, and
when the memory operation is completed, while the first control signal is being enabled for a next second word line, the plurality of page buffers is configured to be sequentially enabled in accordance with the third control signal, and the control unit is configured to access the memory block connected to the enabled page buffer to perform the memory operation.

18. The storage device of claim 13, wherein when there is at least one bad block among the memory blocks corresponding to the access address, the control unit is configured to perform the memory operation for each single memory block, and
when there is no bad block, the control unit is configured to perform the memory operation on at least two memory blocks simultaneously.

19. The storage device of claim 18, wherein a first operating voltage level of the memory operation performed for each single memory block is lower than a second operating voltage level of the memory operation simultaneously performed for the at least two memory blocks.

20. The storage device of claim 19, wherein the second operating voltage level is higher than the first operating voltage level to correspond to the number of the memory blocks on which the memory operation is performed simultaneously.

* * * * *